US012683262B2

(12) United States Patent
Bichler, III

(10) Patent No.: US 12,683,262 B2
(45) Date of Patent: Jul. 14, 2026

(54) BALANCERS FOR ISOLATION BALUNS

(71) Applicant: MACOM Technology Solutions Holdings, Inc., Lowell, MA (US)

(72) Inventor: Anthony Joseph Bichler, III, Durham, NC (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 840 days.

(21) Appl. No.: 18/054,394

(22) Filed: Nov. 10, 2022

(65) Prior Publication Data

US 2024/0162594 A1    May 16, 2024

(51) Int. Cl.
*H01P 5/10* (2006.01)
*H03F 3/195* (2006.01)
*H03F 3/60* (2006.01)

(52) U.S. Cl.
CPC ............... *H01P 5/10* (2013.01); *H03F 3/195* (2013.01); *H03F 3/602* (2013.01); *H03F 2200/09* (2013.01)

(58) Field of Classification Search
None
See application file for complete search history.

(56) References Cited

U.S. PATENT DOCUMENTS

| | | | |
|---|---|---|---|
| 3,784,933 A * | 1/1974 | Scherer ................. | H01P 5/1007 |
| | | | 333/34 |
| 6,392,502 B2 * | 5/2002 | Sweeney ................... | H01P 5/10 |
| | | | 333/33 |
| 2021/0020589 A1 * | 1/2021 | Faiz ........................... | H01P 5/12 |

* cited by examiner

*Primary Examiner* — Andrea Lindgren Baltzell
*Assistant Examiner* — Malane Lieng
(74) *Attorney, Agent, or Firm* — Perilla Knox & Hildebrandt LLP; Jason M. Perilla

(57) ABSTRACT

Power amplifiers including balanced coaxial baluns are described. One example includes first and second amplifiers coupled to a balanced pair of first and second microstrip lines on a circuit board. A balun is coupled between the microstrip lines at a balanced end and between a conductive trace and a ground plane of the circuit board at an unbalanced end of the balun. The balun includes a coaxial balun line and a surface mount balancing inductor. The coaxial line includes center and shield conductors. A first end of the center conductor is coupled to the first microstrip line and a first end of the shield conductor is coupled to the second microstrip line at the balanced end of the balun. The balancing inductor is coupled between the first microstrip line and the ground plane to maintain symmetry for the balanced pair of microstrip lines.

20 Claims, 4 Drawing Sheets

BALANCERS FOR ISOLATION BALUNS

BACKGROUND

For radio frequency (RF) signals, a balanced line or signal pair includes two signal conductors, typically of the same type or format, and a ground conductor. Often, the two signal conductors operate with symmetrical impedances along their lengths. With symmetrical impedances, the two signal conductors in a balanced push pull operation carry equivalent currents that are equal in magnitude and hold a 180° phase relationship. Other examples of balanced lines include twisted pair, twin-lead, ladder line, and twinaxial cable conductors. When used on the output of an amplifier, there is a significant advantage with the suppression of third order products. As opposed to a balanced line, an unbalanced line includes a single signal conductor and a ground conductor. One example of an unbalanced line is a coaxial cable having a shield tied to chassis ground.

A balun is an electrical device relied upon to interface balanced and unbalanced lines, and the term is also an acronym for balanced to un-balanced. An ideal balun interfaces balanced and unbalanced lines without disturbing the impedance symmetry of either line. Several different circuit topologies can be relied upon to implement a balun. Some baluns incorporate passive networks or components and can transform impedances between the balanced and unbalanced ends. These are known as balun transformers. Baluns can be implemented using transformers, autotransformers, chokes, and other arrangements using coaxial cables, twisted pair conductors, and other conductors that are capacitively, magnetically, and capacitively and magnetically coupled in various ways with or without ferrite material depending on the needs of the application for the balun.

SUMMARY

Baluns with balancers and power amplifiers including baluns with balancers are described. An example balun includes a first microstrip line and a second microstrip line at a balanced end of the balun, a conductive trace and a reference node or trace at an unbalanced end of the balun, a coaxial balun line, and a balancing inductor. The coaxial balun line extends between the balanced end and the unbalanced end of the balun. The coaxial balun line includes a center conductor and a shield conductor. A first end of the shield conductor is electrically coupled to the second microstrip line at the balanced end of the balun, and a second end of the shield conductor is electrically coupled to the reference node at the unbalanced end of the balun. The balancing inductor is electrically coupled between the first microstrip line and the reference node.

In other aspects, a first end of the center conductor of the coaxial balun line is electrically coupled to the first microstrip line at the balanced end of the balun. A second end of the center conductor of the coaxial balun line is electrically coupled to the conductive trace at the unbalanced end of the balun. A second end of the shield conductor is electrically coupled to the reference node at the unbalanced end of the balun.

In other aspects, the balancing inductor is embodied as a surface mount inductor. The balancing inductor can also be embodied as a surface mount inductor having an air core. In the balun, an inductance of the balancing inductor electrically matches an inductance of the shield conductor of the coaxial balun line to within, for example, 1%, 2%, 5%, 10%, 15%, or 20%.

In other aspects, the balun is implemented on a printed circuit board (PCB). The PCB includes a dielectric material and a ground plane on a first side of the dielectric material that acts as the reference node on the unbalanced end. The first microstrip line is positioned on a second side of the dielectric material, and the second microstrip line is positioned on the second side of the dielectric material. An output of a first semiconductor power amplifier is electrically coupled to the first microstrip line, and an output of a second semiconductor power amplifier is electrically coupled to the second microstrip line.

Another example balun includes a first balanced line and a second balanced line at a balanced end of the balun, a conductive trace and a reference node or trace at an unbalanced end of the balun, a coaxial balun line, and a balancing inductor. The coaxial balun line extends between the balanced end and the unbalanced end of the balun. The coaxial balun line includes a center conductor and a shield conductor. A first end of the shield conductor is electrically coupled to the second balanced line, and a second end of the shield conductor is electrically coupled to the reference node at the unbalanced end of the balun. The balancing inductor is electrically coupled between the first balanced line and the reference node.

In other aspects, a first end of the center conductor of the coaxial balun line is electrically coupled to the first balanced line at the balanced end of the balun. A second end of the center conductor of the coaxial balun line is electrically coupled to the conductive trace at the unbalanced end of the balun. A second end of the shield conductor is electrically coupled to the reference node at the unbalanced end of the balun.

In other aspects, the balancing inductor is embodied as a surface mount inductor. The balancing inductor can also be embodied as a surface mount inductor having an air core. In the balun, an inductance of the balancing inductor electrically matches an inductance of the shield conductor of the coaxial balun line to within, for example, 1%, 2%, 5%, 10%, 15%, or 20%. In other aspects, the balun is implemented on a PCB. The PCB includes a dielectric material. The first balanced line comprises a first microstrip line on the PCB, and the second balanced line comprises a second microstrip line on the PCB.

In another embodiment, an example power amplifier includes a PCB. The printed circuit board includes a dielectric material, a ground plane on a first side of the dielectric material, a first microstrip line on a second side of the dielectric material, and a second microstrip line on the second side of the dielectric material. The power amplifier also includes a first semiconductor power amplifier having an output electrically coupled to the first microstrip line, and a second semiconductor power amplifier having an output electrically coupled to the second microstrip line.

The power amplifier also includes a balun electrically coupled between the first microstrip line and the second microstrip line at a balanced end of the balun and between a conductive trace on the second side of the dielectric material and the ground plane on the first side of the dielectric material at an unbalanced end of the balun. The balun includes an isolation transformer comprising a first conductor and a second conductor, a first end of the first conductor being electrically coupled to the first microstrip line at the balanced end of the balun and a first end of the second conductor being electrically coupled to the second microstrip line at the balanced end of the balun. The balun also includes a balancing inductor coupled between the first microstrip line and the ground plane.

In one aspect, the isolation transformer includes a coaxial balun line, the first conductor of the isolation transformer includes a central conductor of the coaxial balun line, and the second conductor of the isolation transformer includes a shield conductor of the coaxial balun line. The balancing inductor can be embodied as a surface mount inductor. In the balun, an inductance of the balancing inductor electrically matches an inductance of the second conductor of the isolation transformer to within, for example, 1%, 2%, 5%, 10%, 15%, or 20%.

BRIEF DESCRIPTION OF THE DRAWINGS

Aspects of the present disclosure can be better understood with reference to the following drawings. It is noted that the elements in the drawings are not necessarily drawn to scale, with emphasis instead being placed upon illustrating the principles of the examples. In the drawings, like reference numerals designate like or corresponding, but not necessarily the same, elements throughout the several views.

DETAILED DESCRIPTION

Power amplifiers are relied upon to amplify signals for a variety of purposes, and many radio frequency (RF) signal amplifiers are implemented using semiconductor power amplifiers coupled to printed circuit boards (PCBs). Semiconductor power amplifiers can be coupled to signal traces on a PCB, along with input matching networks for impedance matching, phase matching, and other purposes, output matching networks, power feeds, input connectors, and output connectors. Some amplifiers also rely upon baluns to interface between balanced lines on the PCB and unbalanced lines for next-stage off-PCB systems. A range of design parameters can be important to both the amplifiers and baluns for particular applications.

A balun is an electrical device relied upon to interface balanced and unbalanced lines. An ideal balun interfaces balanced and unbalanced lines without disturbing the impedance arrangement of either line. A number of different balun modes and circuit topologies can be relied upon to implement a balun, and some baluns incorporate passive networks or components to transform impedances between the balanced and unbalanced ends. Example balun modes include current baluns and voltage baluns, and baluns can be implemented using transformers, autotransformers, chokes, and other arrangements using coaxial cables, twisted pair conductors, and other conductors that are capacitively, magnetically, and capacitively and magnetically coupled in various ways depending on the needs of the application for the balun.

Figure 1:
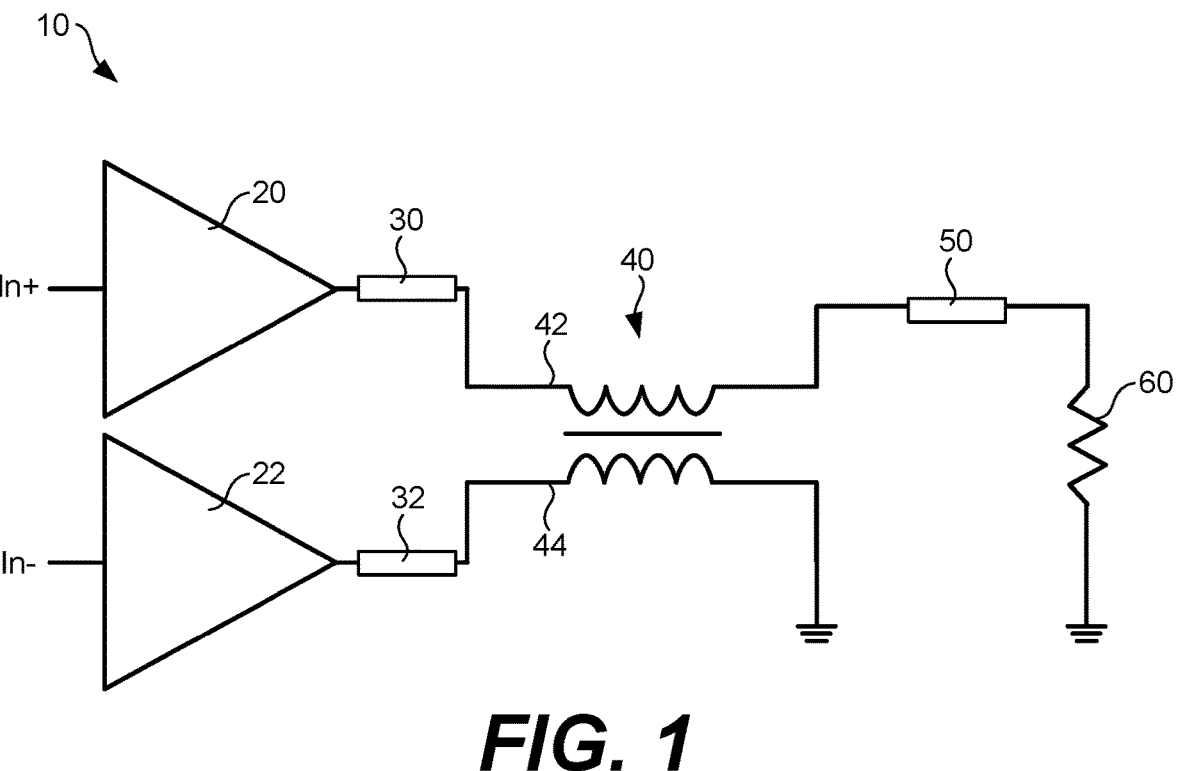
FIG. 1 illustrates an example power amplifier circuit including a balun to interface between balanced and unbalanced lines of the circuit according to various examples described herein.

Power amplifiers including balanced coaxial baluns are described according to various embodiments. One example amplifier includes first and second amplifiers coupled to a balanced pair of first and second microstrip lines on a circuit board. The amplifier also includes a balun coupled between the microstrip lines at a balanced end and between a conductive trace and a ground plane or reference of the circuit board at an unbalanced end of the balun. The balun includes a coaxial balun line and a balancing inductor, among possibly other components. The coaxial balun line includes a center conductor and a shield conductor. A first end of the center conductor is electrically coupled to the first microstrip line at the balanced end of the balun, and a first end of the shield conductor is electrically coupled to the second microstrip line at the balanced end of the balun. A second end of the center conductor is electrically coupled to the conductive trace at the unbalanced end of the balun, and a second end of the shield conductor is electrically coupled to the ground plane or reference at the unbalanced end of the balun. Additionally, the balancing inductor of the balun is coupled between the first microstrip line and the ground plane, to maintain symmetry for the balanced pair of microstrip lines. The balancing inductor can be embodied as another coaxial line, an inductor, a surface mount inductor, or other inductances in various embodiments. The balancing inductor, which can be an air core surface mount balancing inductor in one example, can be selected, tailored, or tuned to provide electrical characteristics that are balanced with the inductance of the shield conductor in the coaxial balun line. Particularly, the shield conductor in the coaxial balun line appears as a shunt impedance to the second microstrip line, and the balancing inductor acts as a type of equivalent shunt impedance to the first microstrip line, so that the first and second microstrip lines maintain balanced, substantially equal impedances. A surface mount balancing inductor, as one example, is smaller and less costly than the use of another length of coaxial line for balancing against the coaxial balun line. Turning to the drawings, FIG. 1 illustrates an example power amplifier circuit 10 (also "circuit 10") including a balun to interface between balanced and unbalanced lines according to various examples described herein. The circuit 10 is provided in FIG. 1 as a representative example of a power amplifier designed for the amplification of RF signals, the use of balanced and unbalanced feeds or lines, and the use of a balun between the balanced and unbalanced lines.

The circuit 10 includes a power amplifier 20, a power amplifier 22, a pair of balanced lines 30 and 32, a balun 40, an unbalanced line 50, and a load 60. The power amplifier circuit 10 can be implemented, at least in part, on a printed circuit board (PCB). The power amplifiers 20 and 22 can be embodied as semiconductor device amplifiers capable of RF signal amplification, and the power amplifiers 20 and 22 are arranged and operated as a push-pull amplification stage in the circuit 10. The power amplifiers 20 and 22 can be embodied as high power, group III-V active semiconductor devices, such as power transistors formed from gallium nitride materials, including gallium nitride (GaN) on a silicon carbide (SiC) substrate in one example. The power amplifiers 20 and 22 can be embodied as other types of power transistors, including GaN on a silicon (Si) substrate and other group III-V active semiconductor devices in other cases. The sizes of the power amplifiers 20 and 22 can be selected for the desired power handling capability of the circuit 10.

The balanced lines 30 and 32 can be implemented in a variety of ways. Examples of balanced lines include, but are not limited to, twisted pair, twin-lead, and twinaxial cable conductors, and the balanced lines 30 and 32 can be embodied as those types or styles of conductive leads in some cases. The balanced lines 30 and 32 can also be embodied as microstrip transmission lines on a printed circuit board in another example. The balanced lines 30 and 32 are designed to have equal impedances along their lengths. In that sense, the balanced lines 30 and 32 can carry currents that are equivalent in magnitude but 180° out of phase (e.g., in direction) with each other, and the push-pull configuration of the power amplifiers 20 and 22 is configured to transfer RF power over the balanced lines 30 and 32.

The unbalanced line 50 is coupled to the load 60. The load 60 is coupled across the unbalanced line 50 to ground, at the output side of the circuit 10. The load 60 can be a 50 Ohm resistive load in one example, as would be common for RF termination matching, although the impedance of the load 60 can vary.

The balun 40 can be implemented in a number of ways, as described herein. The baluns described herein are representative examples, and other types of baluns are known in the field. The balun 40 is an example of a 1:1 current, isolation, or choke balun in the arrangement shown in FIG. 1. In an ideal case, the balun 40 is configured to interface the balanced lines 30 and 32 with the unbalanced line 50 and ground, without disturbing the impedances of the balanced and unbalanced lines or ends. The balun 40 serves to isolate the currents flowing through the unbalanced line 50 and ground from the balanced currents on the balanced lines 30 and 32.

Figure 2:
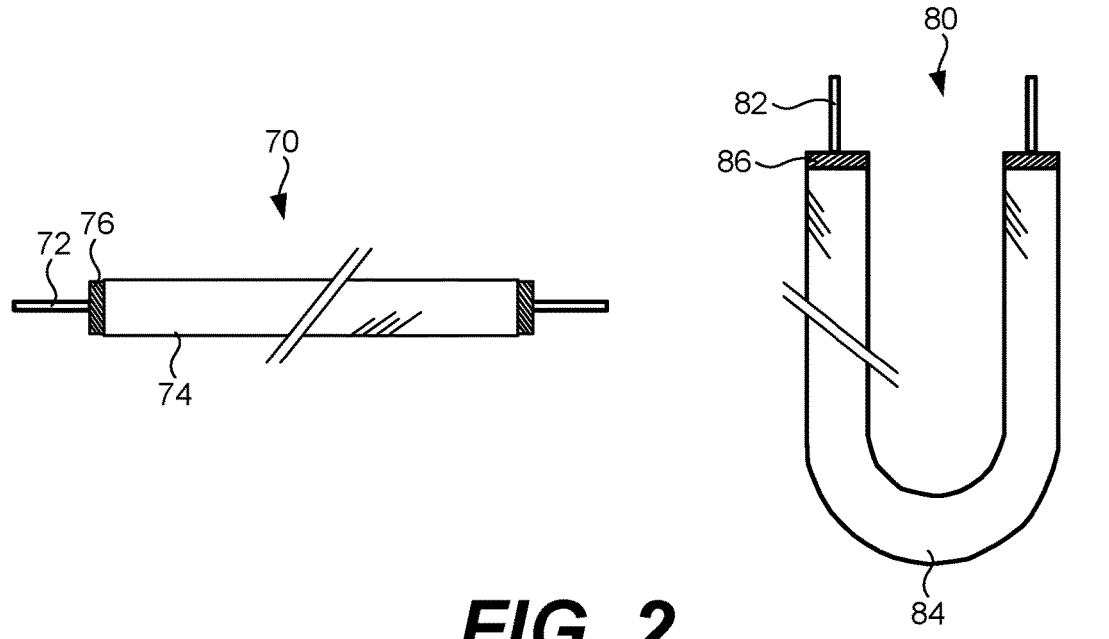
FIG. 2 illustrates example coaxial balun lines according to various examples described herein.

FIG. 2 illustrates example coaxial balun lines 70 and 80 according to various examples described herein. The coaxial balun lines 70 and 80 can be relied upon to form the balun 40 shown in FIG. 1, at least in part. The coaxial balun line 70 can be embodied as a coaxial cable including a central conductor 72, a shield conductor 74, and a dielectric insulator 76 between the central conductor 72 and the shield conductor 74. The length of the coaxial balun line 70 can vary depending on the application. The central conductor 72 can be embodied as a copper conductor of suitable diameter or thickness, although other types of conductive materials can be used. The shield conductor 74 can be a rigid or semi-rigid solid shield of copper or other conductive material, as examples, but the shield conductor 74 can also be embodied as a braided shield conductor in other cases. Although not separately shown in FIG. 2, the coaxial balun line 70 can include an insulative jacket that surrounds the shield conductor 74 and runs along the length of the coaxial balun line 70.

In the circuit 10 shown in FIG. 1, the one end of the central conductor 72 can be electrically coupled to the balanced line 30, one end of the shield conductor 74 can be electrically coupled to the balanced line 32, another end of the central conductor 72 can be electrically coupled to the unbalanced line 50, and another end of the shield conductor 74 can be electrically coupled to ground.

The coaxial balun line 80 can be embodied as a coaxial cable including a central conductor 82, a shield conductor 84, and a dielectric insulator 86 between the central conductor 82 and the shield conductor 84. The length of the coaxial balun line 80 can vary depending on the application. The central conductor 82 can be embodied as a copper conductor of suitable diameter or thickness, although other types of conductive materials can be used. The shield conductor 84 can be a rigid or semi-rigid solid shield of copper or other conductive material, as examples, but the shield conductor 84 can also be embodied as a braided shield conductor or other suitable materials in other cases. Although not separately shown in FIG. 2, the coaxial balun line 80 can include an insulative jacket that surrounds the shield conductor 84 and runs along the length of the coaxial balun line 80.

The coaxial balun line 80 is illustrated to include a one-half turn in FIG. 2, as compared to the coaxial balun line 70. The use of the one-half turn can help to improve the electrical performance of the coaxial balun line 80 for use as a balun. For example, the one-half turn can help to further isolate the unbalanced line 50 from the balanced lines 30 and 32. In the circuit 10 shown in FIG. 1, the one end of the central conductor 82 can be electrically coupled to the balanced line 30, one end of the shield conductor 84 can be electrically coupled to the balanced line 32, another end of the central conductor 82 can be electrically coupled to the unbalanced line 50, and another end of the shield conductor 84 can be electrically coupled to ground.

To some extent, the central conductor 72 of the coaxial balun line 70 can appear as an impedance that is different than the shield conductor 74 at the ends of the balanced lines 30 and 32, respectively. The appearance of different impedances at the ends of the balanced lines 30 and 32 can result in the loss of power transfer to the load, loss of bandwidth for the power amplifiers 20 and 22, and instability, spurs, and oscillations in the operation of the power amplifiers 20 and 22 under certain conditions, among other undesirable effects. Thus, one or more additional components (not shown) can be added to the circuit 10 to help maintain the balanced impedances of the balanced lines 30 and 32 when the coaxial balun line 70 is used for the balun 40.

Similarly, the central conductor 82 of the coaxial balun line 80 can appear as an impedance that is different than the shield conductor 84 at the ends of the balanced lines 30 and 32, respectively, if the coaxial balun line 80 is used for the balun 40. The difference in impedances when using the coaxial balun line 80 can be larger than when using the coaxial balun line 70, due to the one-half turn in the coaxial balun line 80, among other factors. Additionally, three-quarter, full, or multiple turns in a coaxial balun line can lead to more significant impedance mismatches in some cases. Thus, one or more additional components (not shown) can be added to the circuit 10 to help maintain the balanced impedances of the balanced lines 30 and 32 when the coaxial balun line 70 is used for the balun 40.

Figure 3:
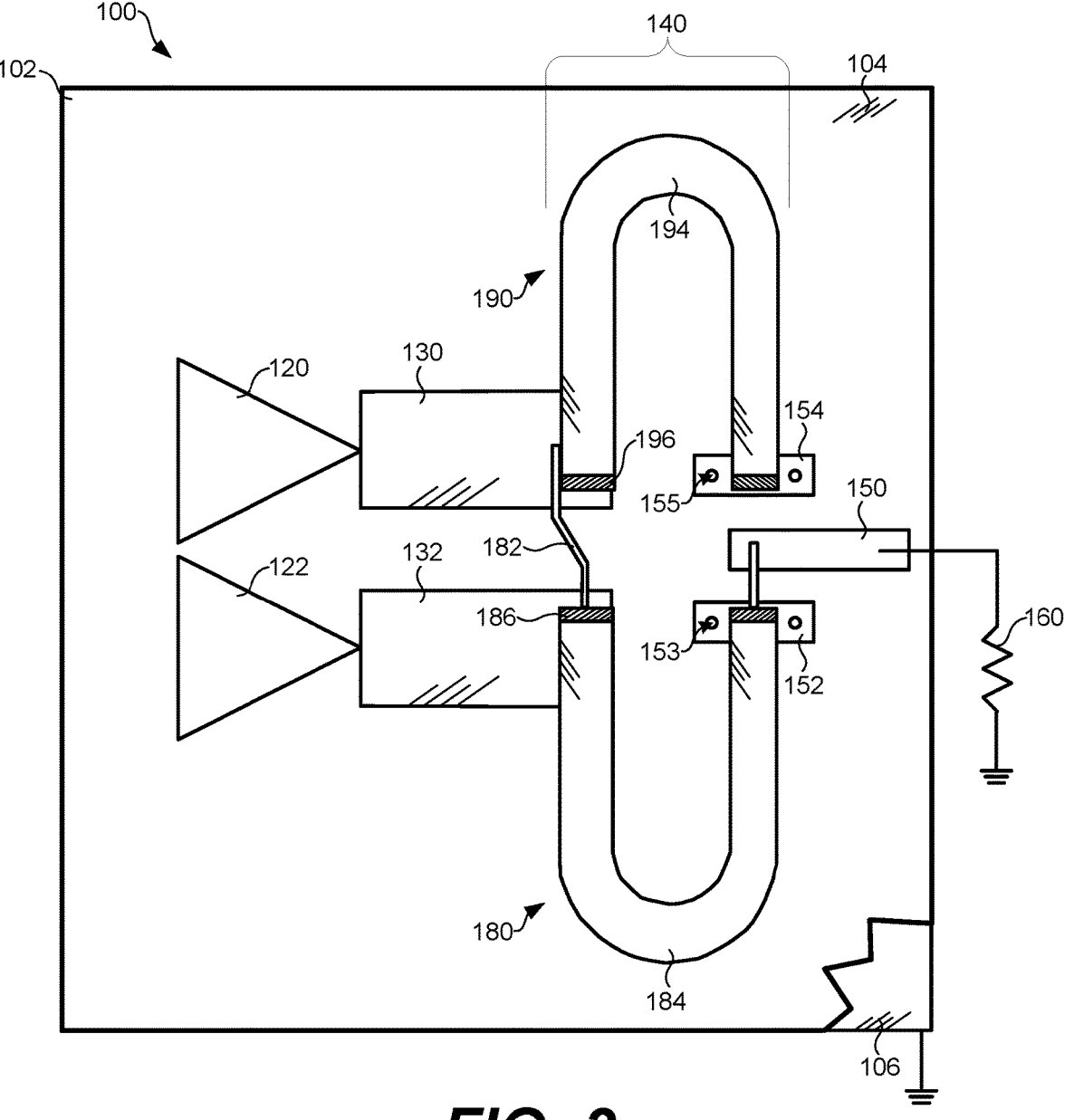
FIG. 3 illustrates a power amplifier circuit including a balun implemented on a printed circuit board according to various examples described herein.

FIG. 3 illustrates a power amplifier circuit 100 (also "power amplifier 100") including a balun 140 implemented on a PCB 102 according to various examples described herein. The power amplifier 100 is provided as a representative example of an amplifier module designed for the amplification of RF signals. The illustration in FIG. 3 is not exhaustive, and the power amplifier 100 can include other components that are not illustrated, such as RF couplers and splitters, input matching networks for impedance matching, phase matching, and other purposes, pre-amplifiers, output matching networks, impedance inverters, power feeds, and other components in some cases. Additionally, one or more components shown in FIG. 3 can be omitted in some cases. Example applications for the power amplifier 100 include power amplification of RF input signals with output power in the range of 100 to 2000 Watts, at frequency ranges between 400 to 600 MHz, although other power levels and frequency ranges are within the scope of the embodiments. The concepts described herein are not limited to use with any particular topology or type of power amplifier.

As described in further detail below with reference to FIG. 4, the PCB 102 includes a central core 104 of laminate or other dielectric material, a first metal layer on one side of the central core 104 for power and signal tracing, and a second metal layer 106 on another side (e.g., the bottom or back side) of the central core 104. The second metal layer 106 acts as a ground plane for the power amplifier 100. The second metal layer 106 can extend over the bottom or back side of the central core 104. In some cases, the second metal layer 106 can extend over the entire or substantially the entire back side of the central core 104 and act as a ground plane for the power amplifier 100, although it is not necessary that the second metal layer 106 extend over the entire back side of the central core 104 in all cases. The first metal layer of the PCB 102 can include a number of metal lines, microstrip transmission lines, and other features, as described below. The PCB 102 can also include a number of conductive through-hole plated vias. The vias can be relied upon to electrically couple the first metal layer of the PCB 102 to the second metal layer 106 at a various locations on the PCB 102.

The power amplifier 100 includes a power amplifier 120, a power amplifier 122, a pair of balanced microstrip transmission lines 130 and 132 (also "microstrip lines 130 and 132"), a balun 140, a conductive trace 150, and a load 60, among other components. The power amplifiers 120 and 122 can be embodied as semiconductor device amplifiers capable of RF signal amplification, and the power amplifiers 120 and 122 are arranged and operated as a push-pull amplification stage in the power amplifier 100. The power amplifiers 120 and 122 can be embodied as high power, group III-V active semiconductor devices, such as power transistors formed from gallium nitride materials, including GaN on a SiC substrate in one example. The power amplifiers 120 and 122 can be embodied as other types of power transistors, including GaN on a Si substrate and other group III-V active semiconductor devices in other cases. The sizes of the power amplifiers 120 and 122 can be selected for the desired power handling capability of the power amplifier 100.

The microstrip lines 130 and 132 have substantially equal impedances along their lengths, and the microstrip lines 130 and 132 are separated from the second metal layer 106 of the PCB 102 by the dielectric material of the central core 104 of the PCB 102. The lengths, widths, and shapes of the microstrip lines 130 and 132 can be designed or tailored for a certain characteristic impedance, as needed based on the application. The microstrip lines 130 and 132 are also designed to carry currents that are equivalent in magnitude but 180° out of phase (e.g., in direction) with each other, and the push-pull configuration of the power amplifiers 120 and 122 is configured to transfer RF power over the microstrip lines 130 and 132.

The load 160 is coupled across the conductive trace 150 and a ground node, which can be common with the second metal layer 106 of the PCB 102. For example, an output connector (e.g., a female or male RF connector) can be electrically coupled between the conductive trace 150 and the second metal layer 106 of the PCB 102, and the load 160 can be electrically coupled with the power amplifier 100 using the output connector. The conductive trace 150 thus acts as an unbalanced line or end at an output of the power amplifier 100, and the second metal layer 106 of the PCB 102 acts as a ground. The load 60 can be a 50 Ohm resistive load in one example, although the impedance of the load 60 can vary.

The balun 140 can be implemented in a number of ways, as described herein. The balun 140 is an example of a 1:1 current, isolation, or choke balun in the arrangement shown in FIG. 3. In an ideal case, the balun 140 is configured to interface the balanced microstrip lines 130 and 132 with the unbalanced conductive trace 150 and the second metal layer 106, without disturbing the impedances of the balanced and unbalanced ends. The balun 140 serves to isolate currents on the conductive trace 150 and the second metal layer 106 from balanced currents on the balanced microstrip lines 130 and 132.

The balun 140 includes the coaxial balun line 180 and the balancing coaxial line 190. The coaxial balun line 180 acts as a type of isolation transformer or choke in the balun 140. The coaxial balun line 180 comprises a coaxial cable including a central conductor 182, a shield conductor 184, and a dielectric insulator 186 between the central conductor 182 and the shield conductor 184. The length of the coaxial balun line 180 can vary among the embodiments depending on the application. The central conductor 182 can be embodied as a copper conductor of suitable diameter or thickness, although other types of conductive materials can be used. The shield conductor 184 can be a rigid or semi-rigid solid shield of copper or other conductive material, as examples, but the shield conductor 184 can also be embodied as a braided shield conductor in other cases. Although not separately shown in FIG. 4, the coaxial balun line 180 can include an insulative jacket that surrounds the shield conductor 184, at least over some lengths of the coaxial balun line 180.

In other examples, the coaxial balun line 180 can be embodied as another type of isolation transformer or choke in the balun 140. For example, the coaxial balun line 180 can be replaced by a balun transformer, such as a 1:1 balun transformer having two conductors electrically coupled in a manner similar to the central conductor 182 and the shield conductor 184 of the coaxial balun line 180 but turned or wrapped one or more times around an air core or a ferrite core. The balancing coaxial line 190 can also be embodied as a coaxial cable including a central conductor (not shown), a shield conductor 194, and a dielectric insulator 196 between the central conductor and the shield conductor 194.

Figure 4:
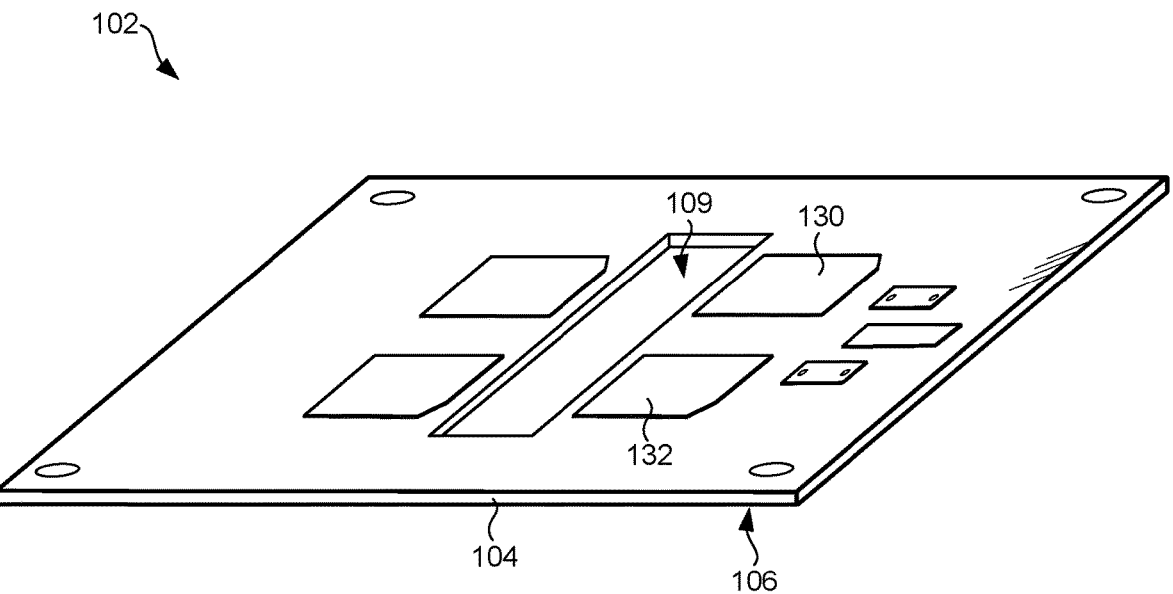
FIG. 4 illustrates aspects of a printed circuit board that can be used for the power amplifier circuit shown in FIG. 3 according to various examples described herein.

As shown in FIG. 4, one end of the central conductor 182 of the coaxial balun line 180 is electrically coupled to the microstrip line 130, one end of the shield conductor 184 is electrically coupled to the microstrip line 32, another end of the central conductor 182 is electrically coupled to the conductive trace 150, and another end of the shield conductor 184 is electrically coupled to the conductive trace 152. The conductive trace 152 is electrically coupled to the second metal layer 106 (e.g., the ground plane) of the PCB 102 by one or more vias 153.

The coaxial balun line 180 is illustrated to include a one-half turn in FIG. 3, although the coaxial balun line 180 can include additional bend or turn segments in some cases. The use of the one-half turn can help to improve the electrical performance of the coaxial balun line 180 for use as a balun. For example, the one-half turn can help to further isolate the unbalanced conductive trace 150 from the balanced microstrip lines 130 and 132. To some extent, the central conductor 182 of the coaxial balun line 180 can appear as an impedance that is different than the shield conductor 184 at the ends of the microstrip lines 130 and 132, respectively. For example, the shield conductor 184 of the coaxial balun line 180 can appear as a shunt inductor on the microstrip line 132, whereas the central conductor 182 may not appear as an equivalent shunt impedance on the microstrip line 130.

The appearance of different impedances on the microstrip lines 130 and 132 can result in an unbalancing effect, the loss of power transfer from the power amplifiers 120 and 122 to the load 160, loss of bandwidth for the power amplifiers 120 and 122, instability in the operation of the power amplifiers 120 and 122 under certain conditions, and other undesirable effects. Thus, the balancing coaxial line 190 of the balun 140 can be relied upon to help maintain balanced impedances for the microstrip lines 130 and 132 when the coaxial balun line 180 is used. Particularly, one end of the shield conductor 194 of the balancing coaxial line 190 is electrically coupled to the microstrip line 130, and another end of the shield conductor 194 is electrically coupled to a conductive trace 154. The conductive trace 154 is electrically coupled to the second metal layer 106 of the PCB 102 by one or more vias 155. In this configuration, the shield conductor 194 of the balancing coaxial line 190 also presents a shunt inductor on the microstrip line 130.

FIG. 4 illustrates aspects of the PCB 102 used for the power amplifier 100 shown in FIG. 3 according to various examples described herein. The PCB 102 is illustrated as a representative example, and other types, styles, shapes, and sizes of PCBs can be relied upon for the power amplifier 100 and other amplifiers including balancers for coaxial baluns according to the embodiments. FIG. 4 omits a number of the components of the power amplifier 100, for simplicity, including the power amplifiers 120 and 122 and the balun 140.

As shown in FIG. 4, the PCB 102 includes a central core 104 of dielectric laminate or other dielectric material, a first metal layer on one side or surface (e.g., the top or front side) of the central core 104 for power and signal tracing, and a second metal layer 106 on another side or surface (e.g., the bottom or back side) of the central core 104 for use as a ground plane. In the example shown, the PCB 102 is embodied as a two-metal-layer PCB, but PCBs including additional layers of metal can be used in some cases.

The dielectric core material can be selected for characteristics suitable for RF power amplifiers. Among other characteristics, the central core 104 can have a dielectric coefficient suitable for high operating frequencies, a low temperature coefficient of dielectric constant, a stable dielectric constant over a wide frequency range, and other preferred characteristics. Example materials include ROGERS® 3006, 3450, 6010, 4003C, 4350B, or 4450B core materials, although others can be relied upon. A suitable thickness of the central core 104 can range from between 40 and 60 mils (i.e., thousandths of an inch), including 40, 45, 50, 55, and 60 mils, although other thicknesses can be relied upon.

The first metal layer of the PCB 102 is segmented or divided into a number of electrically-separated metal traces, for the interconnection of certain components of the power amplifier 100. The first metal layer can include conductive metal traces, microstrip transmission lines, and other features, including the microstrip lines 130 and 132, among others. The second metal layer 106 can extend over the bottom or back side of the central core 104. In some cases, the second metal layer 106 can extend over the entire or substantially the entire back side of the central core 104 and act as a ground plane for the power amplifier 100, although it is not necessary that the second metal layer 106 extend over the entire back side of the central core 104 in all cases. The PCB 102 also includes an opening or aperture 109 in the example shown. The PCB 102 can be positioned over a heat sink (not shown), and the power amplifiers 120 and 122 can be positioned within the aperture 109 and secured to the heat sink for heat dissipation. The outputs of the power amplifiers 120 and 122 can be electrically coupled to the microstrip lines 130 and 132.

Figure 5:
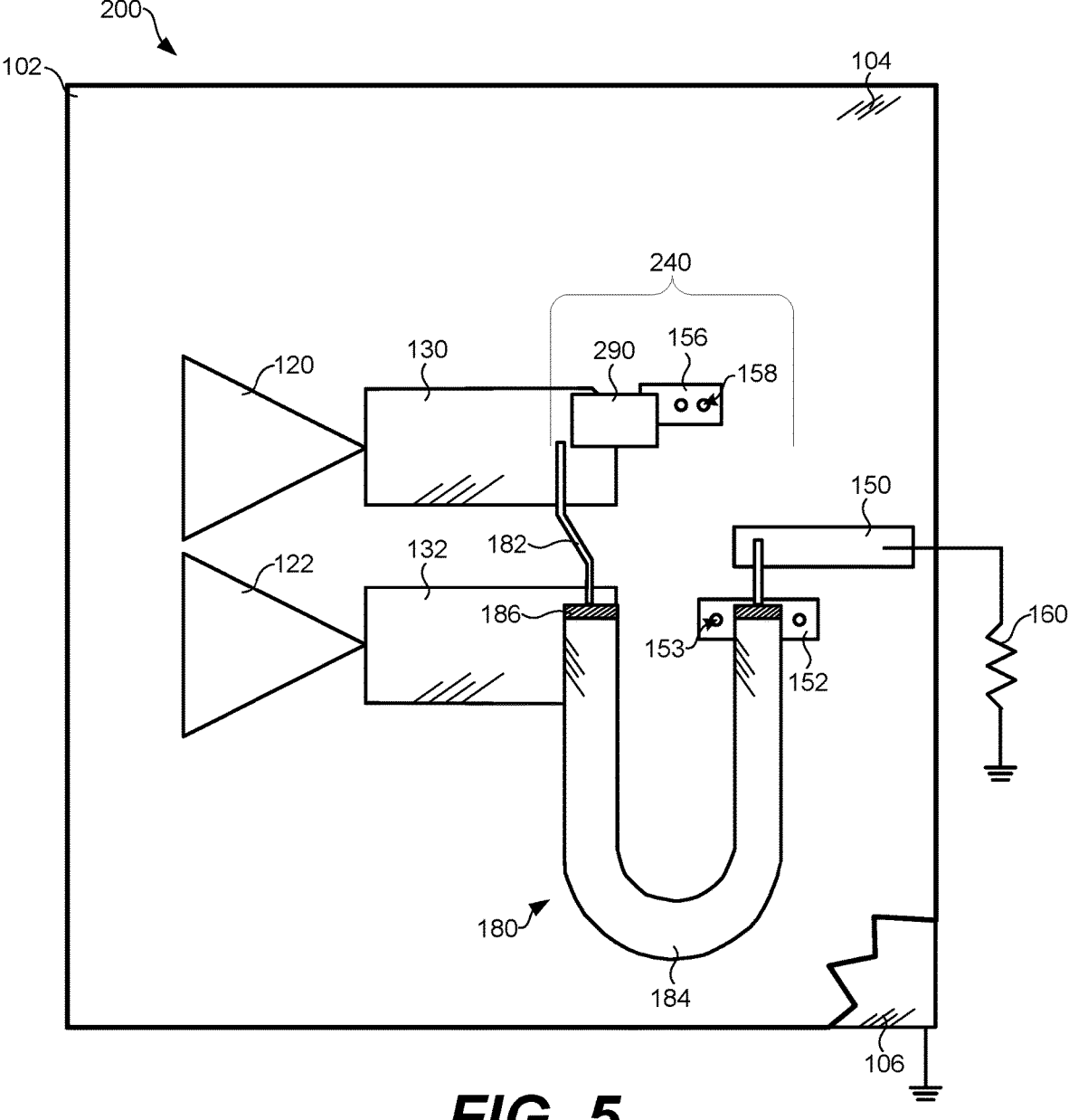
FIG. 5 illustrates another power amplifier circuit including another balun implemented on a printed circuit board according to various examples described herein.

FIG. 5 illustrates another power amplifier circuit 200 (also "power amplifier 200") including a balun 240 implemented on the PCB 102 according to various examples described herein. The power amplifier 200 is similar to the power amplifier 100 shown in FIG. 3 but includes the balun 240 rather than the balun 140. The balun 240 includes a balancing inductor, and particularly a surface mount balancing inductor in the example described below. The concept of using balancing inductors and surface mount balancing inductors are not limited to use in any particular type or types of power amplifiers or baluns, however, as the concept can be extended to other amplifiers and baluns.

The balun 240 is an example of a 1:1 current, isolation, or choke balun in the arrangement shown in FIG. 5. In an ideal case, the balun 240 is configured to interface the balanced microstrip lines 130 and 132 with the unbalanced conductive trace 150 and second metal layer 106, without disturbing the impedances of the balanced and unbalanced ends. The balun 240 serves to isolate currents on the conductive trace 150 and second metal layer 106 from currents on the balanced microstrip lines 130 and 132.

The balun 240 includes the coaxial balun line 180 and a balancing inductor 290. One end of the central conductor 182 of the coaxial balun line 180 is electrically coupled to the microstrip line 130, one end of the shield conductor 184 is electrically coupled to the microstrip line 32, another end of the central conductor 182 is electrically coupled to the conductive trace 150, and another end of the shield conductor 184 is electrically coupled to the conductive trace 152. The conductive trace 152 is electrically coupled to the second metal layer 106 of the PCB 102 by the vias 153.

The coaxial balun line 180 is illustrated to include a one-half turn in FIG. 5, although the coaxial balun line 180 can include additional bend or turn segments in some cases. The use of the one-half turn can help to improve the electrical performance of the coaxial balun line 180 for use as a balun. For example, the one-half turn can help to further isolate the unbalanced conductive trace 150 from the balanced microstrip lines 130 and 132. To some extent, the central conductor 182 of the coaxial balun line 180 can appear as an impedance that is different than the shield conductor 184 at the ends of the microstrip lines 130 and 132, respectively. For example, the shield conductor 184 of the coaxial balun line 180 can appear as a shunt inductor on the microstrip line 132, whereas the central conductor 182 may not appear as an equivalent shunt impedance on the microstrip line 130. The appearance of different impedances on the microstrip lines 130 and 132 can result in an unbalancing effect, the loss of power transfer from the power amplifiers 120 and 122 to the load 160, loss of bandwidth for the power amplifiers 120 and 122, instability in the operation of the power amplifiers 120 and 122 under certain conditions, and other undesirable effects.

Thus, the balancing inductor 290 in the balun 240 can be relied upon to help maintain balanced impedances for the microstrip lines 130 and 132 when the coaxial balun line 180 is used. Particularly, the balancing inductor 290 is electrically coupled between the microstrip line 130, at one end, and a conductive trace 156, at another end. The conductive trace 156 is electrically coupled to the second metal layer 106 of the PCB 102 by one or more vias 158. In this configuration, the balancing inductor 290 also presents a shunt inductor on the microstrip line 130, similar to the way the shield conductor 184 presents a shunt inductor on the microstrip line 132.

In one example, the balancing inductor 290 can be embodied as a surface mount inductor. The balancing inductor 290 can be embodied as a surface mount air core inductor, with a conductor wound in one or more turns in air. The impedance of the balancing inductor 290 can be selected or tailored to match the impedance of the shield conductor 184 of the coaxial balun line 180, considering the extent those impedances alter the characteristic impedances of the microstrip lines 130 and 132 (e.g., as seen by the power amplifiers 120 and 122). The inductance of the balancing inductor 290, for example, can be tailored to match the inductance of the shield conductor 184 to a high degree, such as to within 1%, 2%, 5%, 10%, 15%, or 20% of inductance or impedance matching. The conductor in the balancing inductor 290 can be wound between 1-10 turns, for example, depending on the inductance needed for matching. As examples, the balancing inductor 290 can range in inductance from between 2-45 nH, although the balancing inductor 290 can exhibit other inductances.

The balancing coaxial line 190 in the balun 140 in FIG. 3 may offer a higher degree of impedance matching with the coaxial balun line 180 than the balancing inductor 290 in the balun 240 in FIG. 5, by simply using a balancing coaxial line 190 having the same length and turn shape as the coaxial balun line 180. However, the balancing inductor 290 offers advantages. For example, the balancing inductor 290 is smaller, permits a reduction in the overall form-factor of the power amplifier 200, and is easier to implement using high-volume manufacturing techniques than the balancing coaxial line 190. The balancing coaxial line 190 can be more difficult and time-consuming to install than the balancing inductor 290. The balancing coaxial line 190 is typically installed by a technician, but installation of the balancing inductor 290 can be accomplished using pick-and-place tooling with solder paste and reflow techniques.

The transistors in the power amplifiers 120 and 122 can be formed from group III-V elemental semiconductor materials, including the III-Nitrides (Aluminum (Al), Gallium (Ga), Indium (In), and their alloys (AlGaIn) based Nitrides), Gallium Arsenide (GaAs), Indium Phosphide (InP), Indium Gallium Phosphide (InGaP), Aluminum Gallium Arsenide (AlGaAs), and compounds thereof. In other cases, the transistors in the power amplifiers 120 and 122 can be formed from group IV elemental semiconductor materials, including Silicon (Si), Germanium (Ge), and compounds thereof.

The power amplifiers 120 and 122 can be embodied in gallium nitride materials formed over a Si substrate, a SiC substate, or another suitable substrate. Thus, the power amplifiers 120 and 122 can be embodied as power transistors formed in gallium nitride materials. The concepts described herein are not limited to the use of any particular types of substrates or semiconductor materials, however, and can be extended to use with many different types of semiconductor materials.

The power amplifiers 120 and 122 can be embodied as field effect transistors (FETs). In some cases, the power amplifiers 120 and 122 can include one or more field plates, such as source-connected field plates, gate-connected field plates, or both source-connected and gate-connected field plates. Although FET transistors are described above, the concepts described herein can be applied to bipolar junction transistors, and the amplifiers described herein can be embodied using bipolar junction and other types of transistors. Among other types of FET transistors, the power amplifiers 120 and 122 can be formed as high electron mobility transistors (HEMTs), pseudomorphic high-electron mobility transistors (pHEMTs), metamorphic high-electron mobility transistors (mHEMTs), and laterally diffused metal oxide semiconductor transistors (LDMOS) for use as high efficiency power amplifiers.

The power transistors described herein can be formed using a number of different semiconductor materials and semiconductor manufacturing processes. Example semiconductor materials include the group IV elemental semiconductor materials, including Si and Germanium (Ge), compounds thereof, and the group III elemental semiconductor materials, including Aluminum (Al), Gallium (Ga), and Indium (In), and compounds thereof. Semiconductor transistor amplifiers can be constructed from group III-V direct bandgap semiconductor technologies, in certain cases, as the higher bandgaps and electron mobility provided by those devices can lead to higher electron velocity and breakdown voltages, among other benefits. Thus, in some examples, the concepts can be applied to group III-V direct bandgap active semiconductor devices, such as the III-Nitrides (Aluminum (Al)-, Gallium (Ga)-, Indium (In)-, and their alloys (AlGaIn) based Nitrides), GaAs, InP, InGaP, AlGaAs, etc. devices. However, the concepts can also be applied to transistors and other active devices formed from other semiconductor materials.

The power transistors be embodied as GaN-on-Si transistors, GaN-on-SiC transistors, as well as other types of semiconductor devices. As used herein, the phrase "gallium nitride material" or GaN material refers to gallium nitride and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), among others. Typically, when present, arsenic and/or phosphorous are at low concentrations (e.g., less than 5 weight percent). The term "gallium nitride" or GaN refers directly to gallium nitride, exclusive of its alloys.

The features, structures, and components described above may be combined in one or more embodiments in any suitable manner, and the features discussed in the various embodiments are interchangeable, where technically suitable. In the foregoing description, numerous specific details are provided in order to fully understand the embodiments of the present disclosure. However, a person skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

Although relative terms such as "on," "below," "upper," "lower," "top," "bottom," "right," and "left" may be used to describe the relative spatial relationships of certain structural features, these terms are used for convenience only, as a direction in the examples. It should be understood that if the device is turned upside down, the "upper" component will become a "lower" component. When a structure or feature is described as being "over" (or formed over) another structure or feature, the structure can be positioned over the other structure, with or without other structures or features intervening between them. When two components are described as being "coupled to" each other, the components can be electrically coupled to each other, with or without other components being electrically coupled and intervening between them. When two components are described as being "directly coupled to" each other, the components can be electrically coupled to each other, without other components being electrically coupled between them.

Terms such as "a," "an," "the," and "said" are used to indicate the presence of one or more elements and components. The terms "comprise," "include," "have," "contain," and their variants are used to be open ended and may include or encompass additional elements, components, etc., in addition to the listed elements, components, etc., unless otherwise specified.

Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. A balun, comprising:
a first microstrip line;
a second microstrip line;
a coaxial balun line extending between a balanced end of the balun and an unbalanced end of the balun, the coaxial balun line comprising a center conductor and a shield conductor, a first end of the shield conductor being electrically coupled to the second microstrip line at the balanced end of the balun, and a second end of the shield conductor being electrically coupled to a reference node at the unbalanced end of the balun; and
a balancing inductor electrically coupled between the first microstrip line and the reference node.

2. The balun of claim 1, wherein a first end of the center conductor of the coaxial balun line is electrically coupled to the first microstrip line at the balanced end of the balun.

3. The balun of claim 2, wherein a second end of the center conductor of the coaxial balun line is electrically coupled to a conductive trace at the unbalanced end of the balun.

4. The balun of claim 3, wherein the second end of the shield conductor of the coaxial balun line is electrically coupled to the reference node at the unbalanced end of the balun by one or more vias.

5. The balun of claim 1, wherein the balancing inductor comprises a surface mount inductor.

6. The balun of claim 1, wherein the balancing inductor comprises a surface mount inductor having an air core.

7. The balun of claim 1, wherein, in the balun, an inductance of the balancing inductor electrically matches an inductance of the shield conductor of the coaxial balun line to within 10%.

8. The balun of claim 1, wherein:
the balun is implemented on a printed circuit board (PCB); and
the PCB comprises:
a dielectric material;
a ground plane on a first side of the dielectric material;
the first microstrip line on a second side of the dielectric material; and
the second microstrip line on the second side of the dielectric material.

9. The balun of claim 1, wherein:
an output of a first semiconductor power amplifier is electrically coupled to the first microstrip line; and
an output of a second semiconductor power amplifier is electrically coupled to the second microstrip line.

10. A balun, comprising:
a first balanced line;
a second balanced line;
a coaxial balun line extending between a balanced end of the balun and an unbalanced end of the balun, the coaxial balun line comprising a center conductor and a shield conductor, a first end of the shield conductor being electrically coupled to the second balanced line at the balanced end of the balun, and a second end of the shield conductor being electrically coupled to a reference node at the unbalanced end of the balun; and
a balancing inductor electrically coupled between the first balanced line and the reference node.

11. The balun of claim 10, wherein:
a first end of the center conductor of the coaxial balun line is electrically coupled to the first balanced line at the balanced end of the balun; and
a second end of the center conductor of the coaxial balun line is electrically coupled to a conductive trace at the unbalanced end of the balun.

12. The balun of claim 11, wherein the second end of the shield conductor of the coaxial balun line is electrically coupled to the reference node at the unbalanced end of the balun by one or more vias.

13. The balun of claim 10, wherein the balancing inductor comprises a surface mount inductor.

14. The balun of claim 10, wherein the balancing inductor comprises a surface mount inductor having an air core.

15. The balun of claim 10, wherein, in the balun, an inductance of the balancing inductor electrically matches an inductance of the shield conductor of the coaxial balun line to within 10%.

16. The balun of claim 10, wherein:
the balun is implemented on a printed circuit board (PCB);
the first balanced line comprises a first microstrip line on the PCB; and
the second balanced line comprises a second microstrip line on the PCB.

17. A power amplifier, comprising:
a printed circuit board (PCB), the printed circuit board comprising:
a dielectric material;
a ground plane on a first side of the dielectric material;
a first microstrip line on a second side of the dielectric material; and
a second microstrip line on the second side of the dielectric material;
a first semiconductor power amplifier having an output electrically coupled to the first microstrip line;
a second semiconductor power amplifier having an output electrically coupled to the second microstrip line; and
a balun electrically coupled between the first microstrip line and the second microstrip line at a balanced end of the balun and between a conductive trace on the second side of the dielectric material and the ground plane on the first side of the dielectric material at an unbalanced end of the balun, the balun comprising:
an isolation transformer comprising a first conductor and a second conductor, a first end of the first conductor being electrically coupled to the first microstrip line at the balanced end of the balun and a first end of the second conductor being electrically coupled to the second microstrip line at the balanced end of the balun; and a balancing inductor electrically coupled between the first microstrip line and the ground plane.

18. The power amplifier of claim 17, wherein:

the isolation transformer comprises a coaxial balun line;

the first conductor of the isolation transformer comprises a central conductor of the coaxial balun line; and the second conductor of the isolation transformer comprises a shield conductor of the coaxial balun line.

19. The power amplifier of claim 17, wherein the balancing inductor comprises a surface mount inductor.

20. The power amplifier of claim 17, wherein, in the balun, an inductance of the balancing inductor electrically matches an inductance of the second conductor of the isolation transformer to within 10%.

* * * * *